US010658257B1

(12) United States Patent
Chen et al.

(10) Patent No.: US 10,658,257 B1
(45) Date of Patent: May 19, 2020

(54) SEMICONDUCTOR PACKAGE STRUCTURE, SEMICONDUCTOR WAFER LEVEL PACKAGE AND SEMICONDUCTOR MANUFACTURING PROCESS

(71) Applicant: Advanced Semiconductor Engineering, Inc., Kaohsiung (TW)

(72) Inventors: Dao-Long Chen, Kaohsiung (TW); Chih-Pin Hung, Kaohsiung (TW); Ming-Hung Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/178,241

(22) Filed: Nov. 1, 2018

(51) Int. Cl.
*H01L 23/29* (2006.01)
*H01L 23/498* (2006.01)
*H01L 23/31* (2006.01)
*H01L 21/56* (2006.01)
*H01L 21/48* (2006.01)
*H01L 23/00* (2006.01)

(52) U.S. Cl.
CPC ........ *H01L 23/295* (2013.01); *H01L 21/4853* (2013.01); *H01L 21/561* (2013.01); *H01L 23/3128* (2013.01); *H01L 23/3185* (2013.01); *H01L 23/49816* (2013.01); *H01L 23/49822* (2013.01); *H01L 24/16* (2013.01); *H01L 2224/16227* (2013.01)

(58) Field of Classification Search
CPC ......... H01L 23/16; H01L 23/22; H01L 21/78; H01L 25/042; H01L 25/0655
USPC .................................. 257/737, 773; 438/106
See application file for complete search history.

(56) References Cited

U.S. PATENT DOCUMENTS

| 9,543,242 | B1* | 1/2017 | Kelly | ................ H01L 23/49816 |
| 9,818,684 | B2* | 11/2017 | Hiner | ..................... H01L 21/56 |
| 2009/0315170 | A1* | 12/2009 | Shim | ................... H01L 21/6835 257/692 |
| 2012/0018871 | A1* | 1/2012 | Lee | ..................... H01L 25/0655 257/698 |
| 2015/0243636 | A1 | 8/2015 | Hu et al. | |
| 2017/0117200 | A1* | 4/2017 | Kim | ....................... H01L 21/561 |
| 2018/0230004 | A1* | 8/2018 | Pan | ....................... B81C 1/0023 |
| 2019/0148250 | A1* | 5/2019 | Yu | .......................... H01L 23/18 257/773 |

* cited by examiner

Primary Examiner — David Vu
Assistant Examiner — Brandon C Fox
(74) Attorney, Agent, or Firm — Foley & Lardner LLP

(57) ABSTRACT

A semiconductor package structure includes a semiconductor die, at least one wiring structure, an encapsulant and a plurality of conductive elements. The semiconductor die has an active surface. The at least one wiring structure is electrically connected to the active surface of the semiconductor die. The encapsulant surrounds the semiconductor die. The encapsulant is formed from an encapsulating material, and a Young's Modulus of the encapsulant is from 0.001 GPa to 1 GPa. The conductive elements are embedded in the encapsulant, and are electrically connected to the at least one wiring structure.

17 Claims, 14 Drawing Sheets

US 10,658,257 B1

SEMICONDUCTOR PACKAGE STRUCTURE, SEMICONDUCTOR WAFER LEVEL PACKAGE AND SEMICONDUCTOR MANUFACTURING PROCESS

BACKGROUND

1. Field of the Disclosure

The present disclosure relates to a semiconductor package structure, a semiconductor wafer level package and a semiconductor manufacturing process, and more particularly to a semiconductor package structure including a soft encapsulant, a semiconductor wafer level package and a semiconductor manufacturing process.

2. Description of the Related Art

The trend for an electronic product is light, thin, short and small. The semiconductor package structures are designed toward to the above demand. However, warpage may occur to a thin semiconductor package structure. A warpaged semiconductor package structure cannot be readily attached to a substrate, an interposer or a printed circuit board during a reflow process. This creates a risk of a peeling situation.

SUMMARY

In some embodiments, according to an aspect, a semiconductor package structure includes a semiconductor die, at least one wiring structure, an encapsulant and a plurality of conductive elements. The semiconductor die has an active surface. The at least one wiring structure is electrically connected to the active surface of the semiconductor die. The encapsulant surrounds the semiconductor die. The encapsulant is formed from an encapsulating material, and a Young's Modulus of the encapsulant is from 0.001 GPa to 1 GPa. The conductive elements are embedded in the encapsulant, and are electrically connected to the at least one wiring structure.

In some embodiments, according to another aspect, a semiconductor wafer level package includes at least one semiconductor die, at least one wiring layer, an encapsulant and a plurality of conductive elements. The semiconductor die has an active surface. The at least one wiring structure is electrically connected to the active surface of the semiconductor die. The encapsulant surrounds the at least one semiconductor die. The encapsulant is formed from an encapsulating material, and a Young's Modulus of the encapsulant is from 0.001 GPa to 1 GPa. The conductive elements are embedded in the encapsulant, and are electrically connected to the at least one wiring layer.

In some embodiments, according to another aspect, a semiconductor manufacturing process includes: (a) providing a carrier; (b) forming a wiring layer on the carrier; (c) mounting at least one semiconductor die on the wiring layer; and (d) forming an encapsulant and a plurality of conductive elements, wherein the encapsulant surrounds the at least one semiconductor die, the conductive elements are embedded in the encapsulant and electrically connected to the wiring layer, wherein the encapsulant is formed from an encapsulating material, and a Young's Modulus of the encapsulant is from 0.001 GPa to 1 GPa.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
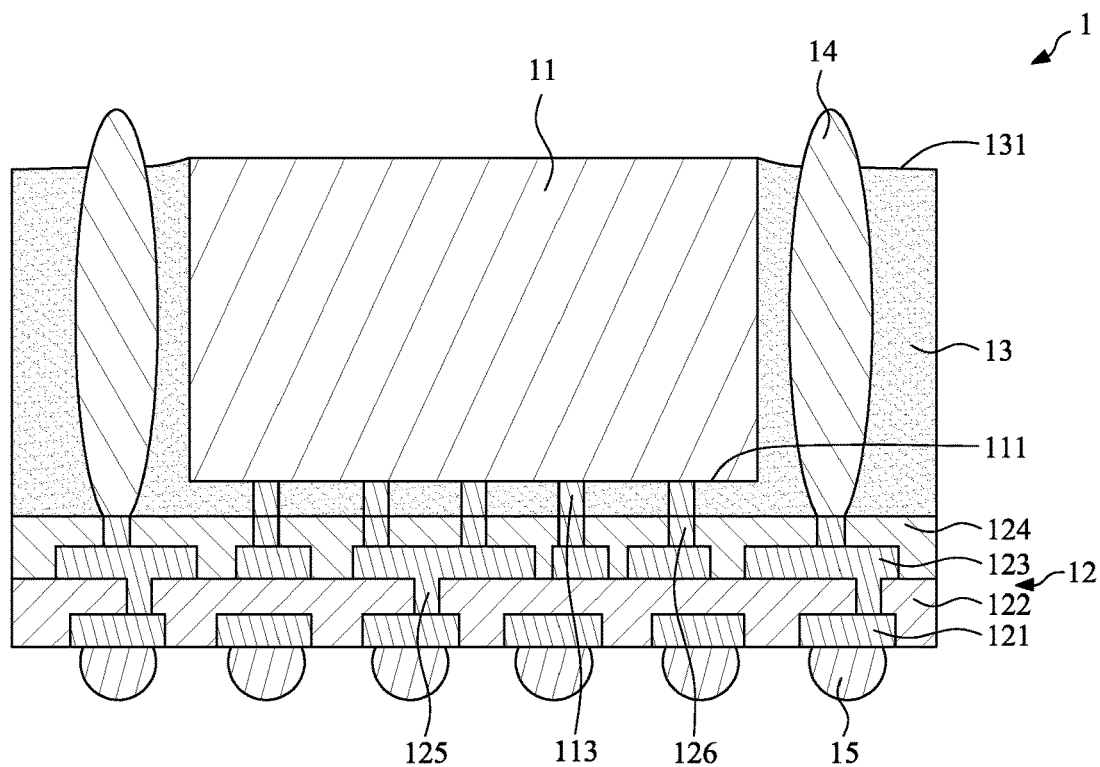
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the semiconductor-associated industry, according to design specifications, a thickness of the Fan-Out product is less than 200 µm. For example, for the semiconductor package structure size of 15 mm*15 mm, the thickness of the semiconductor package structure is controlled to be less than 200 µm. By a simulation, the warpage amount of the semiconductor package structure is about 745 µm at 25° C. and about −282 µm at 260° C. The warpaged semiconductor package structure cannot readily meet the design specifications for the total warpage amount, for example +/−80 µm. The semiconductor package structure with a large warpage cannot be readily attached to the substrate, the interposer or the printed circuit board during the reflow process. This creates a risk of a peeling situation.

To address at least the above concerns, some embodiments of the present disclosure provide an encapsulating material to form an encapsulant, instead of a typical molding compound. And, a Young's Modulus of the encapsulant in some embodiments is between 0.001 GPa and 1 GPa. Due to the low Young's Modulus, the encapsulant is soft. Therefore, the semiconductor package structure of the present disclosure can be bent and can be attached to the substrate, the interposer or the printed circuit board during the reflow process. Thus, the warpage problem can be resolved. The semiconductor package structure of the present disclosure can meet the design specifications for the total warpage amount, for example +/−80 µm.

FIG. 1 illustrates a cross-sectional view of an example of a semiconductor package structure 1 according to some embodiments of the present disclosure. The semiconductor package structure 1 includes a semiconductor die 11, at least one wiring structure 12, an encapsulant 13 and a plurality of conductive elements 14. The semiconductor die 11 has an active surface 111 and a plurality of conductive pillars 113 disposed adjacent to the active surface 111. The at least one wiring structure 12 is electrically connected to the active surface 111 of the semiconductor die 11. In some embodiments, the conductive pillars 113 of the semiconductor die 11 are disposed on and electrically connected to the at least one wiring structure 12. Thus, the active surface 111 faces the wiring structure 12.

In some embodiments, the wiring structure 12 may include a first redistribution layer 121, a first dielectric layer 122, a second redistribution layer 123 and a second dielectric layer 124. The first dielectric layer 122 covers the first redistribution layer 121, and the second dielectric layer 124 covers the second redistribution layer 123. The first redistribution layer 121 may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The first redistribution layer 121 may include at least one conductive via 125 disposed in the through hole of the first dielectric layer 122, and at least one conductive pad. In some embodiments, the first redistribution layer 121 may further include at least one trace.

In some embodiments, the first dielectric layer 122 may be made of an insulating material or a dielectric material, such as, for example, polypropylene (PP). It is noted that the first dielectric layer 122 may include, or be formed from, a cured photoimageable dielectric (PID) material such as epoxy or polyimide (PI) including photoinitiators. The first dielectric layer 122 defines at least one through hole extending through the first dielectric layer 122.

In some embodiments, the second redistribution layer 123 is electrically connected to the first redistribution layer 121 through the conductive via 125. The second redistribution layer 123 may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The second redistribution layer 123 may include at least one conductive via 126 disposed in the through hole of the second dielectric layer 124, and at least one conductive pad. In some embodiments, the second redistribution layer 121 may further include at least one trace.

In some embodiments, the second dielectric layer 124 may be made of an insulating material or a dielectric material, such as, for example, polypropylene (PP). It is noted that the second dielectric layer 124 may include, or be formed from, a cured photoimageable dielectric (PID) material such as epoxy or polyimide (PI) including photoinitiators. The second dielectric layer 124 defines at least one through hole extending through the second dielectric layer 124.

The encapsulant 13 surrounds or covers at least a portion of the semiconductor die 11. The encapsulant 13 is formed from an encapsulating material, and a Young's Modulus of the encapsulant is between 0.001 GPa and 1 GPa. In some embodiments, the encapsulating material includes a polymer, such as epoxy, rubber, silicone rubber, silicone mold compound or polyimide. The above encapsulating material may be utilized to form the encapsulant 13 instead of the typical molding compound. Due to the low Young's Modulus, the encapsulant 13 of the present disclosure is soft. Therefore, the semiconductor package structure 1 of the present disclosure can be bent to be attached to the substrate, the interposer or the printed circuit board during the reflow process. Thus, the warpage problem can be resolved. The semiconductor package structure 1 of the present disclosure can meet the design specifications for the total warpage amount.

In some embodiments, the encapsulating material may be silicone mold compound, and the Young's Modulus of the encapsulant 13 formed from silicone mold compound is about 0.35 GPa. The semiconductor package structure 1 of the present disclosure may be measured by a flexibility test, for example, three points test. Two ends of the bottom portion of the semiconductor package structure 1 are supported, and a force of 1 NT is applied at the center of the top portion of the semiconductor package structure 1. The flexibility of the semiconductor package structure 1 is a deformation amount of semiconductor package structure 1. That is, the flexibility of the semiconductor package structure 1 is a displacement value of a point at the center portion of semiconductor package structure after the force of 1 NT is applied. If the flexibility of the semiconductor package structure 1 is large, it means that the semiconductor package structure 1 is soft enough to be bent to be attached to the substrate, the interposer or the printed circuit board during the reflow process. After the flexibility test, the flexibility of the semiconductor package structure 1 having silicone mold compound is about 1543 µm.

In some embodiments, the encapsulating material may be silicone rubber, and the Young's Modulus of the encapsulant 13 formed from silicone rubber is about 0.001 GPa. After the flexibility test, the flexibility of the semiconductor package structure 1 according to the above embodiment is about 1773 µm. That is, the semiconductor package structure 1 having silicone rubber with a Young's Modulus of 0.001 GPa is softer than the semiconductor package structure 1 having silicone mold compound with a Young's Modulus of 0.35 GPa.

In some embodiments, the flexibility of the semiconductor package structure 1 is larger than about 1000 µm. By a simulation of the relation between the Young's Modulus and the flexibility, when the Young's Modulus of the encapsulant 13 is less than about 1 GPa, the flexibility of the semiconductor package structure 1 may be larger than about 1000 µm.

In some embodiments, a thickness of the semiconductor package structure 1 is less than about 200 µm, and the flexibility of the semiconductor package structure 1 is larger than about 1000 µm. That is, for a thin semiconductor package structure 1, the flexibility of the semiconductor package structure 1 may be large enough to overcome the warpage problem during the reflow process.

In some embodiments, the encapsulating material may include silicon filler. A content of the silicon filler in the encapsulating material may be about 1% to about 30% by weight. When the content of the silicon filler in the encapsulating material is few, the encapsulating material is soft. And, it can prevent the pores problem and incomplete filling problem during the molding process. In other embodiments, the encapsulating material may not include silicon filler.

In some embodiments, the encapsulant 13 defines a recess portion 131 disposed on a peripheral of the semiconductor package structure 1. That is, the peripheral of the encapsulant 13 may not have a consistent height.

The conductive elements 14 are embedded in the encapsulant 13, and are electrically connected to the at least one wiring structure 12 through the conductive via 126. The conductive elements 14 may surround the semiconductor die 11, and a height of the conductive element 14 may be greater than a thickness of the semiconductor die 11. Part of the conductive element 14 is exposed from the encapsulant 13 for electrically connecting to the external element. That is, a portion of the conductive element 14 may protrude from the recess portion 131 of the encapsulant 13. In some embodiments, the conductive elements 14 may be solder balls. A material of the conductive elements 14 may be a conductive metal, such as tin, or another metal or combination of metals. In some embodiments, the semiconductor package structure 1 further includes a plurality of solder connectors 15. The solder connectors 15 are electrically connected to the bottom of the at least one wiring structure 12. A material of the solder connectors 15 may be a conductive metal, such as tin, or another metal or combination of metals.

Figure 2:
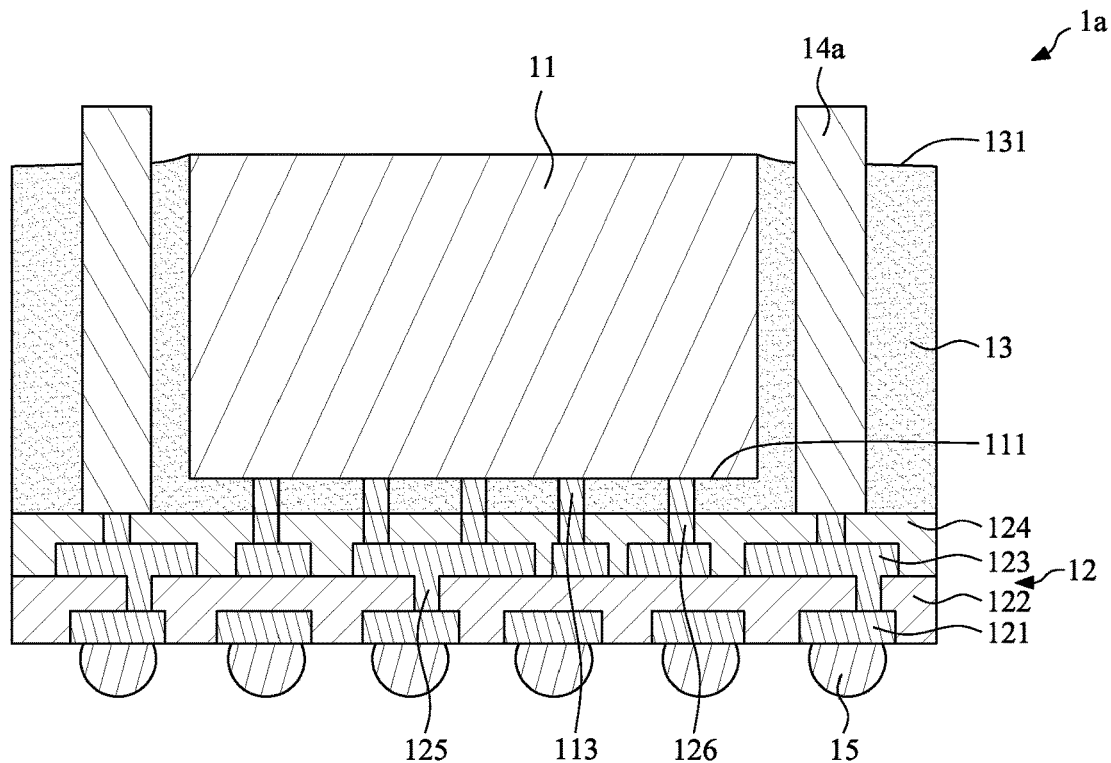
FIG. 2 illustrates a cross-sectional view of an example of a semiconductor package structure according to some embodiments of the present disclosure.

FIG. 2 illustrates a cross-sectional view of an example of a semiconductor package structure 1a according to some embodiments of the present disclosure. The semiconductor package structure 1a shown in FIG. 2 is similar to the semiconductor package structure 1 shown in FIG. 1, and the differences are described as follows. In some embodiments, the conductive elements 14a may be metal pillars. Part of the conductive element 14a is exposed from the encapsulant 13 for electrically connecting to the external element. A material of the conductive elements 14a may be a conductive metal, such as copper, or another metal or combination of metals.

Figure 3:
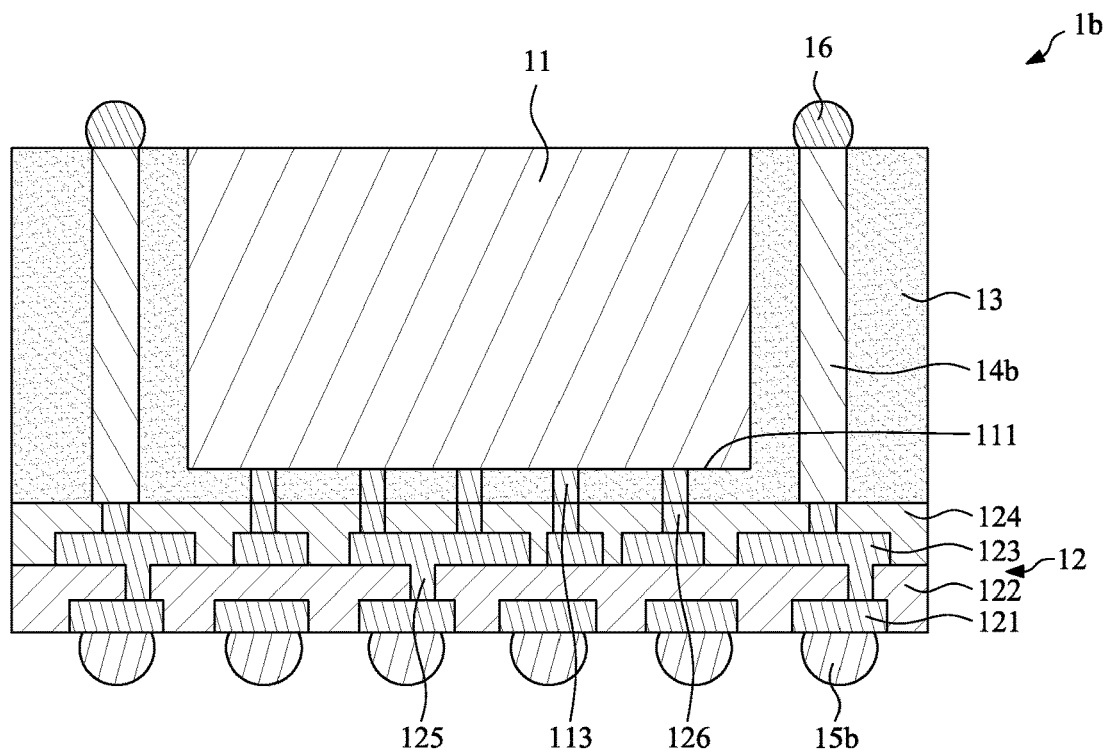
FIG. 3 illustrates a cross-sectional view of an example of a semiconductor package structure according to some embodiments of the present disclosure.

FIG. 3 illustrates a cross-sectional view of an example of a semiconductor package structure 1b according to some embodiments of the present disclosure. The semiconductor package structure 1b shown in FIG. 3 is similar to the semiconductor package structure 1a shown in FIG. 2, and the differences are described as follows. In some embodiments, the top surface of the conductive element 14b and the top surface of the semiconductor die 11 may be coplanar with the top surface of the encapsulant 13, and the top surface of the conductive element 14b and the top surface of the semiconductor die 11 are exposed from the encapsulant 13. The encapsulant 13 of FIG. 3 may not define the recess portion 131 of FIG. 2. The semiconductor package structure 1b further includes a plurality of first solder connectors 15b and a plurality of second solder connectors 16. The first solder connectors 15b are electrically connected to the bottom of the at least one wiring structure 12. The second solder connectors 16 are electrically connected to the top surface of the conductive elements 14b. The second solder connectors 16 may be used for electrically connecting to the external element.

Figure 4:
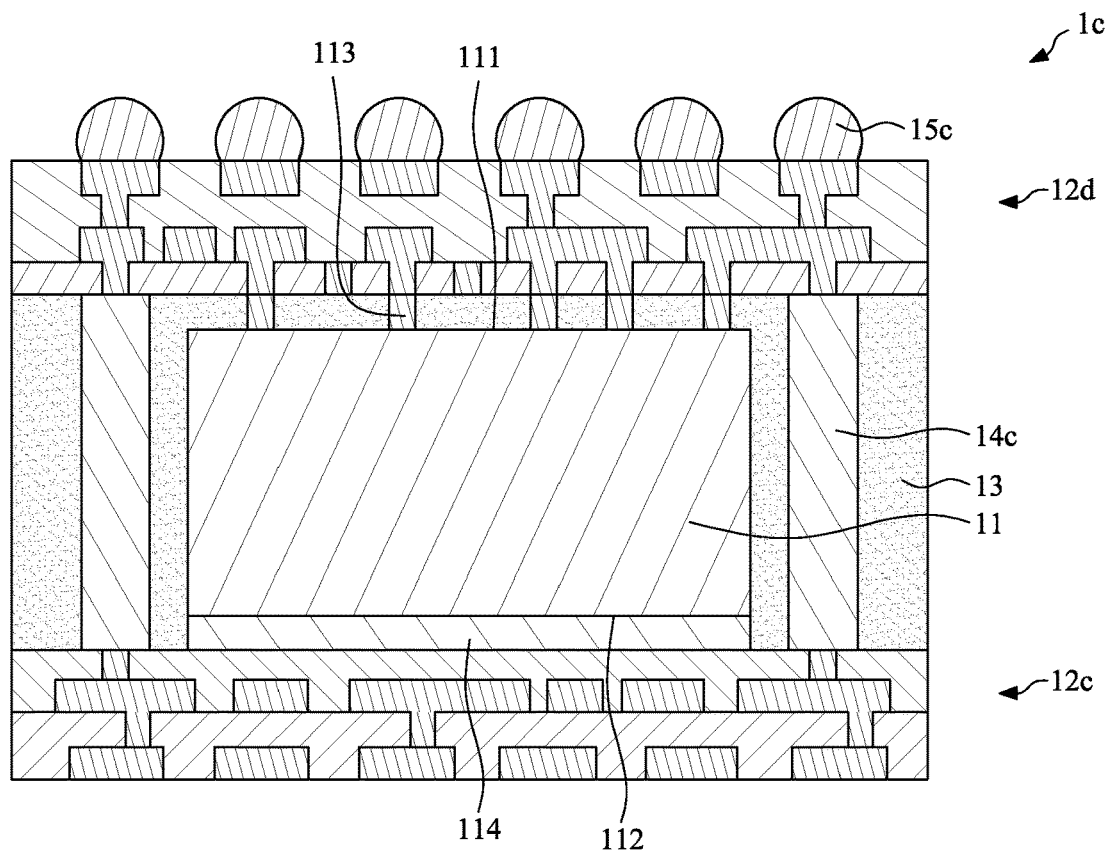
FIG. 4 illustrates a cross-sectional view of an example of a semiconductor package structure according to some embodiments of the present disclosure.

FIG. 4 illustrates a cross-sectional view of an example of a semiconductor package structure 1c according to some embodiments of the present disclosure. In some embodiments, the semiconductor package structure 1c includes a first wiring structure 12c and a second wiring structure 12d. The first wiring structure 12c is disposed adjacent to a back surface 112 of the semiconductor die 11, and the second wiring structure 12d is disposed adjacent to the active surface 111 of the semiconductor die 11. The back surface 112 of the semiconductor die 11 is adhered to the top surface of the first wiring structure 12c through an adhesion layer 114. The first wiring structure 12c is electrically connected to the bottom surfaces of the conductive elements 14c. The second wiring structure 12d is electrically connected to the top surfaces of the conductive elements 14c and the active surface 111 of the semiconductor die 11. The semiconductor package structure 1c further includes a plurality of solder connectors 15c. The solder connectors 15c are electrically connected to the second wiring structure 12d. A material of the solder connectors 15c may be a conductive metal, such as tin, or another metal or combination of metals.

Figure 5:
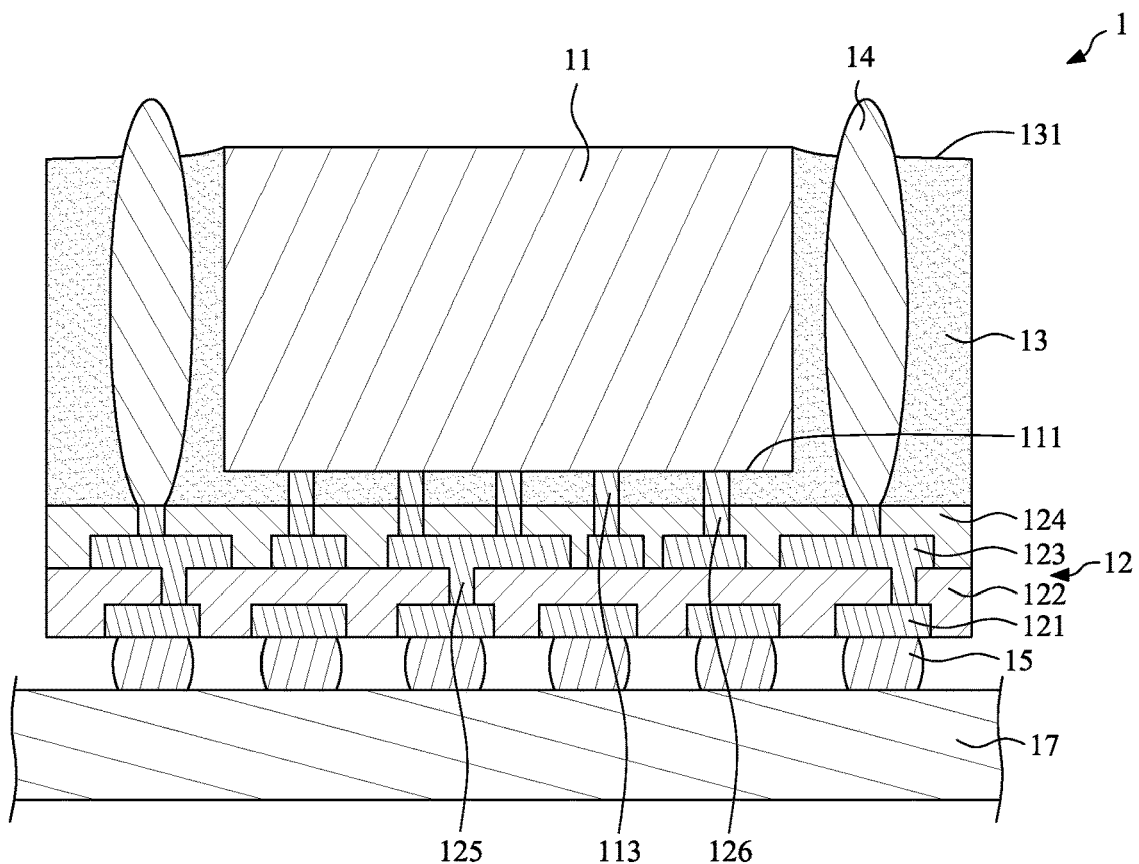
FIG. 5 illustrates a cross-sectional view of an example of an assembly of a semiconductor package structure and a substrate according to some embodiments of the present disclosure.

FIG. 5 illustrates a cross-sectional view of an example of an assembly of a semiconductor package structure 1 and a substrate 17 according to some embodiments of the present disclosure. In some embodiments, the semiconductor package structure 1 is attached to a substrate 17. The substrate 17 may be a mother board, an interposer or a printed circuit board. The substrate 17 is electrically connected to the solder connectors 15.

FIGS. 6 to 12 illustrate a semiconductor manufacturing process according to some embodiments of the present disclosure. In some embodiments, the semiconductor manufacturing process is for manufacturing a semiconductor package structure such as the semiconductor package structure 1 shown in FIGS. 1 and 5.

Figure 6:
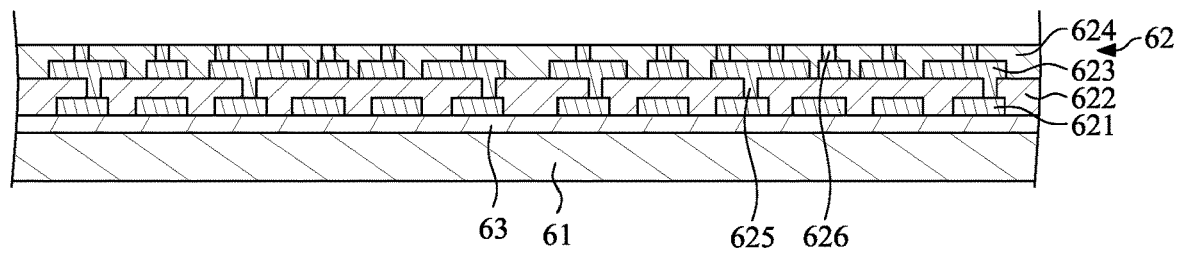
FIG. 6 illustrates one or more stages of an example of a semiconductor manufacturing process according to some embodiments of the present disclosure.

Referring to FIG. 6, a carrier 61 is provided, and a wiring layer 62 is formed or disposed thereon. In some embodiments, there is a release layer 63 disposed between the carrier 61 and the wiring layer 62. In some embodiments, the wiring layer 62 may include a first redistribution layer 621, a first dielectric layer 622, a second redistribution layer 623 and a second dielectric layer 624. The first dielectric layer 622 covers the first redistribution layer 621, and the second dielectric layer 624 covers the second redistribution layer 623. The first redistribution layer 621 may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The first redistribution layer 621 may include at least one conductive via 625 disposed in the through hole of the first dielectric layer 622, and at least one conductive pad. In some embodiments, the first redistribution layer 621 may further include at least one trace.

In some embodiments, the first dielectric layer 622 may be made of an insulating material or a dielectric material, such as, for example, polypropylene (PP). It is noted that the first dielectric layer 622 may include, or be formed from, a cured photoimageable dielectric (PID) material such as epoxy or polyimide (PI) including photoinitiators. The first dielectric layer 622 defines at least one through hole extending through the first dielectric layer 622.

In some embodiments, the second redistribution layer 623 is electrically connected to the first redistribution layer 621 through the conductive via 625. The second redistribution layer 623 may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The second redistribution layer 623 may include at least one conductive via 626 disposed in the through hole of the second dielectric layer 624, and at least one conductive pad. In some embodiments, the second redistribution layer 621 may further include at least one trace.

In some embodiments, the second dielectric layer 624 may be made of an insulating material or a dielectric material, such as, for example, polypropylene (PP). It is noted that the second dielectric layer 624 may include, or be formed from, a cured photoimageable dielectric (PID) material such as epoxy or polyimide (PI) including photoinitiators. The second dielectric layer 624 defines at least one through hole extending through the second dielectric layer 624.

Figure 7:
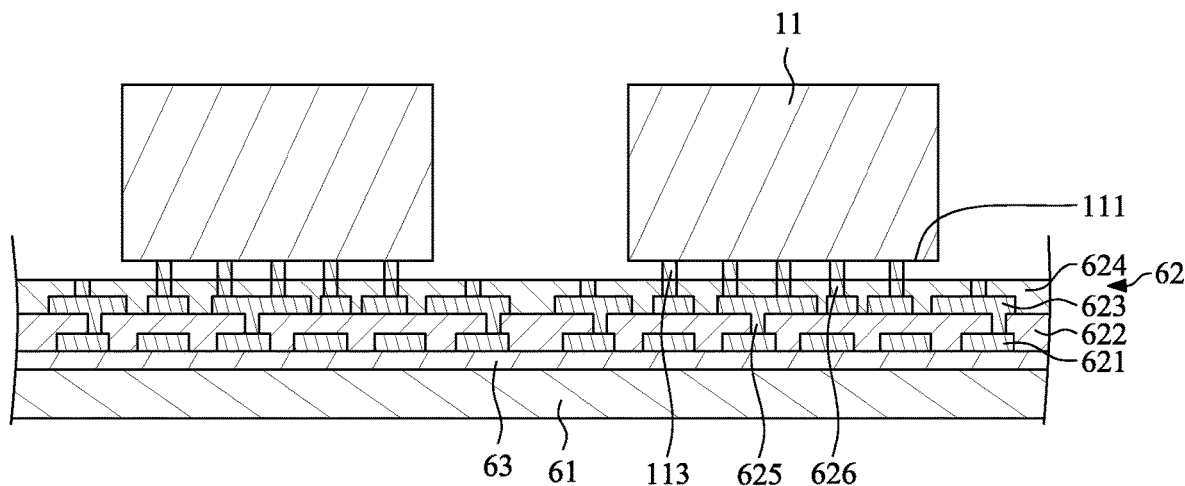
FIG. 7 illustrates one or more stages of an example of a semiconductor manufacturing process according to some embodiments of the present disclosure.

Referring to FIG. 7, at least one semiconductor die 11 is mounted on the wiring layer 62. The semiconductor die 11 has an active surface 111 and a plurality of conductive pillars 113 disposed adjacent to the active surface 111. The wiring layer 62 is electrically connected to the active surface 111 of the semiconductor die 11. In some embodiments, the conductive pillars 113 of the semiconductor die 11 are disposed on and electrically connected to the at least one wiring layer 62. Thus, the active surface 111 faces the wiring layer 62.

Figure 8:
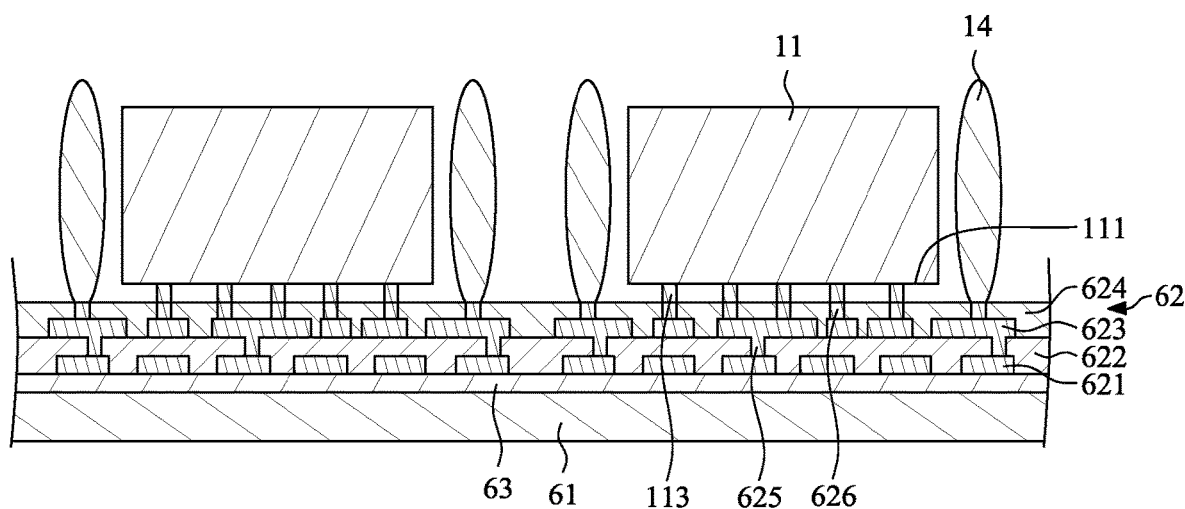
FIG. 8 illustrates one or more stages of an example of a semiconductor manufacturing process according to some embodiments of the present disclosure.

Referring to FIG. 8, the conductive elements 14 are formed on the wiring layer 62 and are electrically connected to the wiring layer 62. In some embodiments, the conductive elements 14 may be solder balls. A material of the conductive elements 14 may be a conductive metal, such as tin, or another metal or combination of metals.

Figure 9:
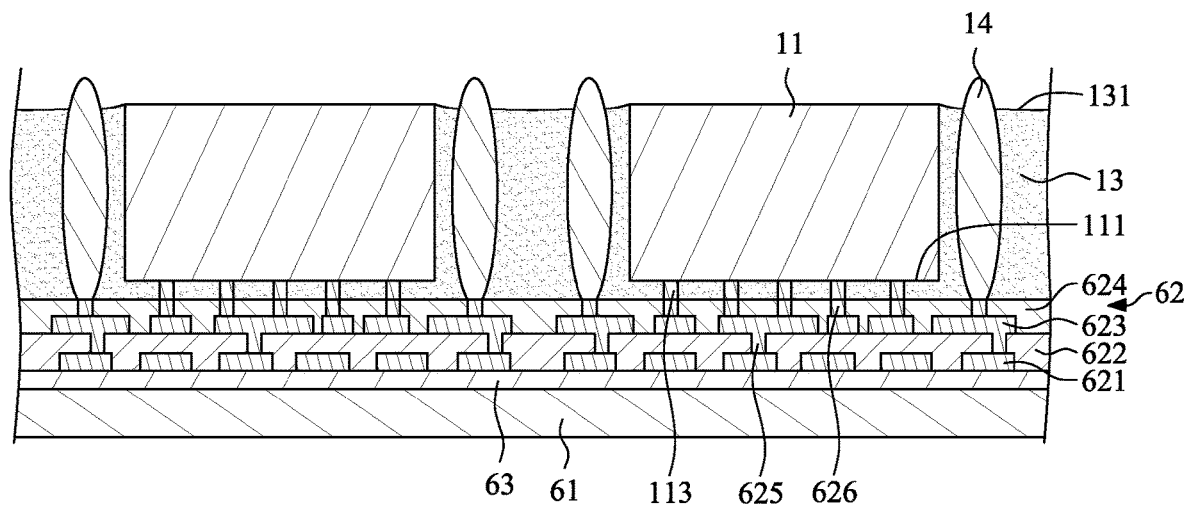
FIG. 9 illustrates one or more stages of an example of a semiconductor manufacturing process according to some embodiments of the present disclosure.

Referring to FIG. 9, the encapsulant 13 is formed to surround or cover the at least one semiconductor die 11 and the conductive elements 14. The encapsulant 13 is formed from an encapsulating material, and a Young's Modulus of the encapsulant 13 is between 0.001 GPa and 1 GPa. In some embodiments, the encapsulating material includes a liquid polymer such epoxy, rubber, silicone rubber, silicone mold compound or polyimide. In some embodiments, the encapsulating material may include silicon filler. A content of silicon filler in the encapsulating material may be about 1% to about 30% by weight. The above encapsulating material may be utilized to form the encapsulant 13 instead of the typical molding compound. The encapsulating material may be formed by coating, dispensing or molding. After a curing process, the encapsulating material is cured to become the encapsulant 13. Due to the low Young's Modulus, the encapsulant 13 of the present disclosure is soft. Therefore, the semiconductor package structure 1 (FIG. 1) of the present disclosure can be bent to be attached to the substrate, the interposer or the printed circuit board during the reflow process. Thus, the warpage problem can be resolved. The semiconductor package structure 1 (FIG. 1) of the present disclosure can meet the design specifications for the total warpage amount.

In some embodiments, the encapsulant 13 may defines a recess portion 131 disposed on an area between two adjacent semiconductor dies 11.

Figure 10:
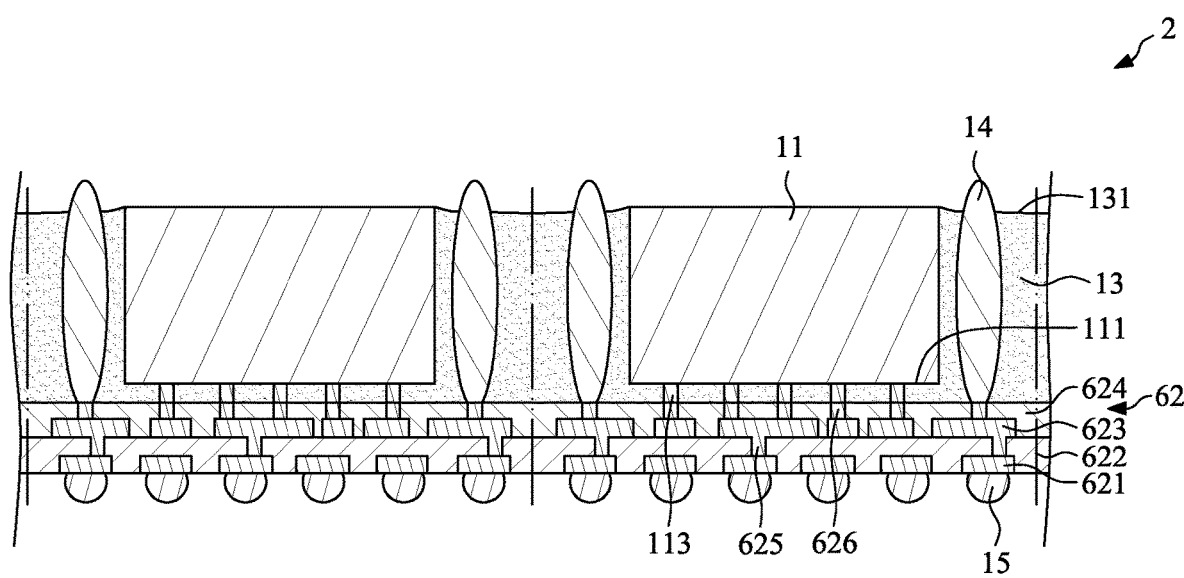
FIG. 10 illustrates one or more stages of an example of a semiconductor manufacturing process according to some embodiments of the present disclosure.

Referring to FIG. 10, the carrier 61 and the release layer 63 are removed. Then, a plurality of solder connectors 15 are formed to electrically connected to the at least one wiring layer 62. A material of the solder connectors 15 may be a conductive metal, such as tin, or another metal or combination of metals. Thus, a semiconductor wafer level package 2 is formed. The semiconductor wafer level package 2 includes at least one semiconductor die 11, at least one wiring layer 62, the encapsulant 13 and a plurality of conductive elements 14. The semiconductor die 11 has an active surface 111. The at least one wiring structure 62 is electrically connected to the active surface 111 of the semiconductor die 11. The encapsulant 13 surrounds the at least one semiconductor die 11. The encapsulant 13 is formed from an encapsulating material, and a Young's Modulus of the encapsulant 13 is between 0.001 G Pa and 1 G Pa. The conductive elements 14 are embedded in the encapsulant 13, and are electrically connected to the at least one wiring layer.

Figure 11:
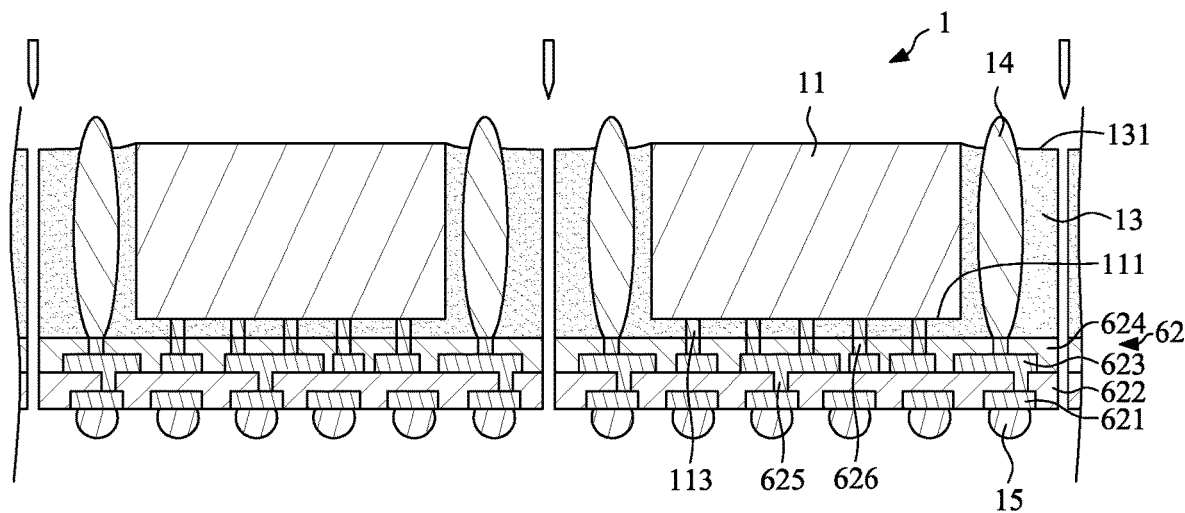
FIG. 11 illustrates one or more stages of an example of a semiconductor manufacturing process according to some embodiments of the present disclosure.

Referring to FIG. 11, a singulation process is conducted to cut the semiconductor wafer level package 2 to form each of semiconductor package structures 1 as shown in FIG. 1.

Figure 12:
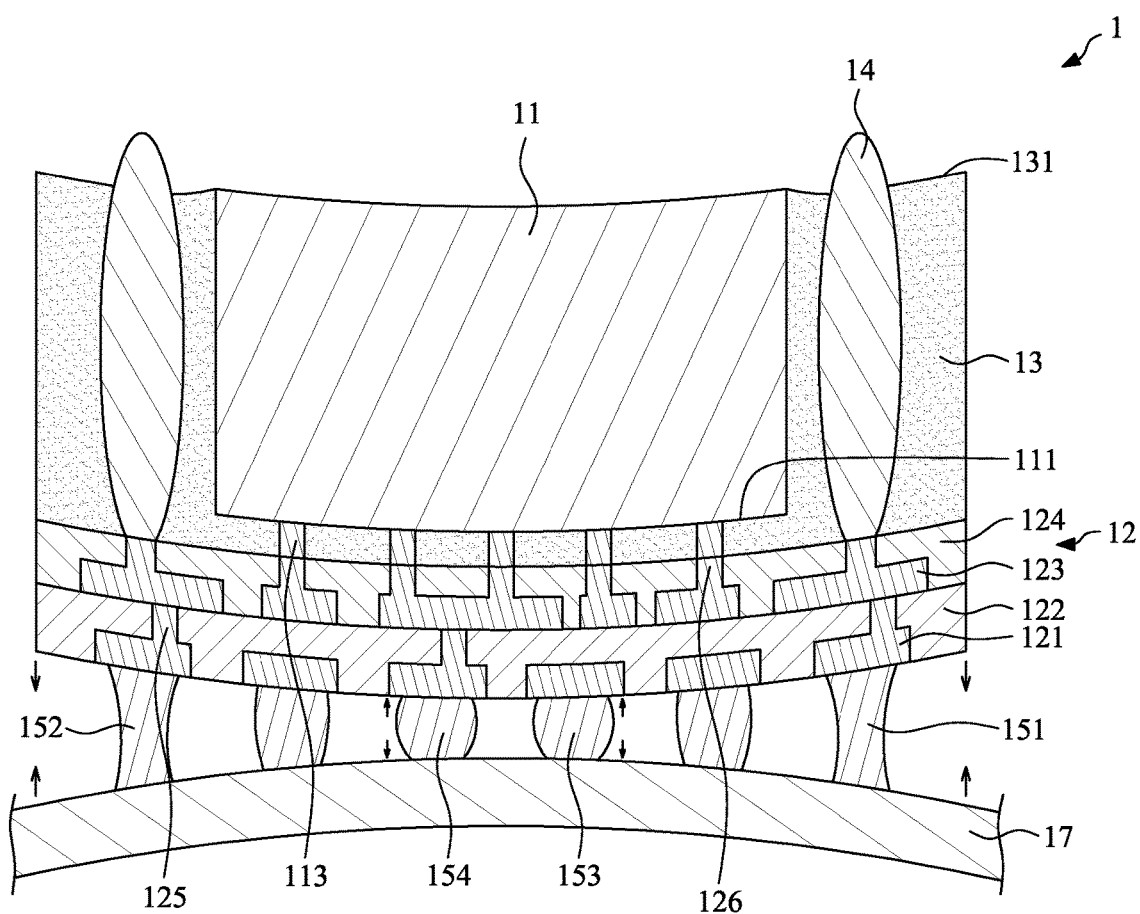
FIG. 12 illustrates one or more stages of an example of a semiconductor manufacturing process according to some embodiments of the present disclosure.

Referring to FIG. 12, the semiconductor package structure 1 is attached to a substrate 17. The substrate 17 may be an interposer or a printed circuit board. The substrate 17 is electrically connected to the solder connectors 15. During the reflow process, the solder connectors 151, 152 on the side are melted to extend, and the solder connectors 151, 152 may have pulling forces to the semiconductor package structure 1 and the substrate 17. Besides, the solder connectors 153, 154 at the center are melted to press, and the solder connectors 153, 154 may have pushing forces to the semiconductor package structure 1 and the substrate 17. Thus, if the semiconductor package structure 1 is soft enough, the solder connectors 151, 152 may easily pull the semiconductor package structure 1 and the substrate 17, and the solder connectors 153, 154 may easily push the semiconductor package structure 1 and the substrate 17. Since the pulling forces and the pushing forces of the solder connectors 15 may produce force couple, the semiconductor package structure 1 and the substrate 17 can be bent to attach to each other as shown in FIG. 5. Therefore, the total warpage amount of the semiconductor package structure 1 with respect to the substrate 17 can be reduced. The semiconductor package structure of the present disclosure can meet the design specifications for the total warpage amount, for example +/−80 μm.

Figure 13:
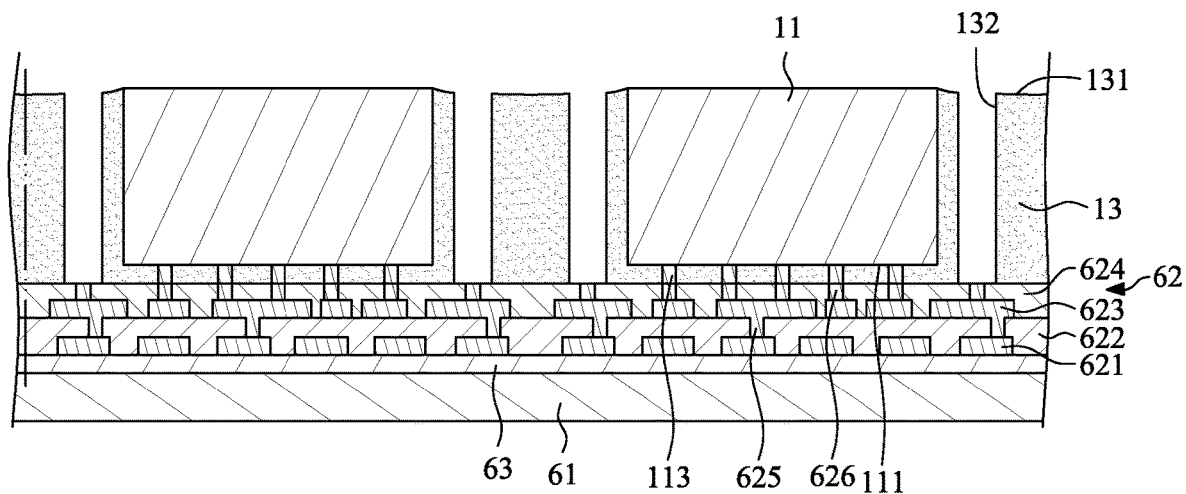
FIG. 13 illustrates one or more stages of an example of a semiconductor manufacturing process according to some embodiments of the present disclosure.
Figure 14:
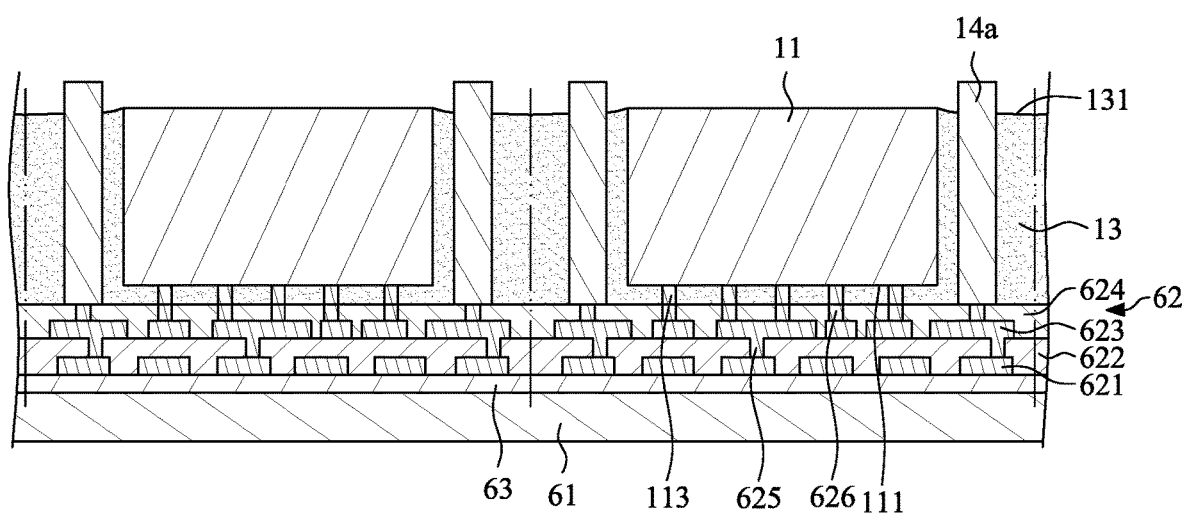
FIG. 14 illustrates one or more stages of an example of a semiconductor manufacturing process according to some embodiments of the present disclosure.
Figure 15:
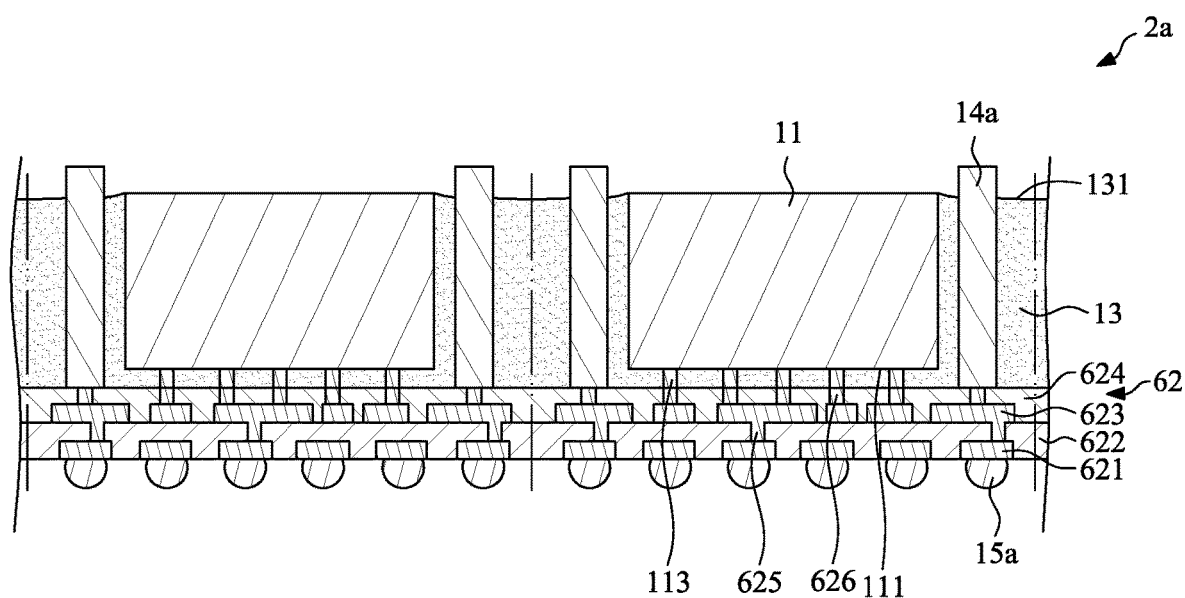
FIG. 15 illustrates one or more stages of an example of a semiconductor manufacturing process according to some embodiments of the present disclosure.

FIGS. 13 to 15 illustrate a semiconductor manufacturing process according to some embodiments of the present disclosure. In some embodiments, the semiconductor manufacturing process is for manufacturing a semiconductor package structure such as the semiconductor package structure 1a shown in FIG. 2. The initial stages of the illustrated process are the same as, or similar to, the stages illustrated in FIG. 6 through FIG. 7. FIG. 13 depicts a stage subsequent to that depicted in FIG. 7.

As shown in FIG. 13, the encapsulant 13 is formed to surround the at least one semiconductor die 11, then a plurality of through holes 132 are formed to extend through the encapsulant 13. In some embodiments, a laser is used to drill the through holes 132. That is, the through holes 132 may be formed by laser drilling.

The encapsulant 13 is formed from an encapsulating material, and a Young's Modulus of the encapsulant 13 is between 0.001 GPa and 1 GPa. In some embodiments, the encapsulating material includes a liquid polymer such epoxy, rubber, silicone rubber, silicone mold compound or polyimide. In some embodiments, the encapsulating material may include silicon filler. A content of the silicon filler in the encapsulating material may be about 1% to about 30% by weight. The above encapsulating material may be utilized to form the encapsulant 13 instead of the typical molding compound. The encapsulating material may be formed by coating, dispensing or molding. After a curing process, the encapsulating material is cured to become the encapsulant 13. Due to the low Young's Modulus, the encapsulant 13 of the present disclosure is soft. Therefore, the semiconductor package structure 1a (FIG. 2) of the present disclosure can be bent to be attached to the substrate, the interposer or the printed circuit board during the reflow process. Thus, the warpage problem can be resolved. The semiconductor package structure 1a (FIG. 2) of the present disclosure can meet the design specifications for the total warpage amount.

Referring to FIG. 14, the conductive elements 14a are formed in the through holes 132 by, for example, plating. In some embodiments, the conductive elements 14a may be metal pillars. Part of the conductive element 14a is exposed from the encapsulant 13 for electrically connecting to the external element. A material of the conductive elements 14a may be a conductive metal, such as copper, or another metal or combination of metals.

Referring to FIG. 15, the carrier 61 and the release layer 63 are removed. Then, a plurality of solder connectors 15 are formed to electrically connected to the at least one wiring layer 62. A material of the solder connectors 15 may be a conductive metal, such as tin, or another metal or combination of metals. Thus, a semiconductor wafer level package 2a is formed. The semiconductor wafer level package 2a includes at least one semiconductor die 11, at least one wiring layer 62, the encapsulant 13 and a plurality of conductive elements 14a. The semiconductor die 11 has an active surface 111. The at least one wiring structure 62 is electrically connected to the active surface 111 of the semiconductor die 11. The encapsulant 13 surrounds the at least one semiconductor die 11. The encapsulant 13 is formed from an encapsulating material, and a Young's Modulus of the encapsulant 13 is between 0.001 G Pa and 1 G Pa. The conductive elements 14a are embedded in the encapsulant 13, and are electrically connected to the at least one wiring layer 62.

Figure 16:
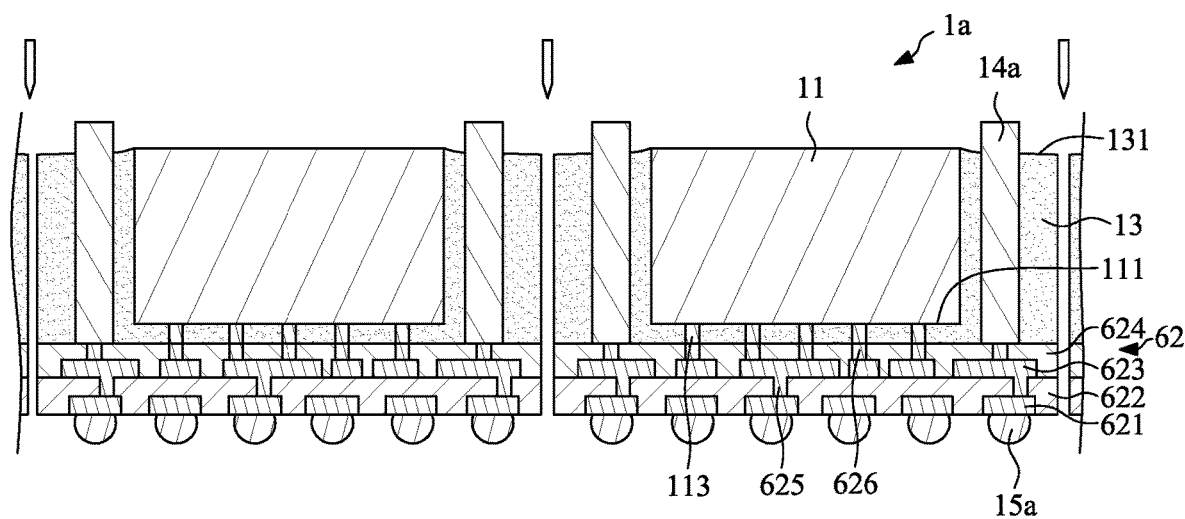
FIG. 16 illustrates one or more stages of an example of a semiconductor manufacturing process according to some embodiments of the present disclosure.

Referring to FIG. 16, a singulation process is conducted to cut the semiconductor wafer level package 2a to form each of semiconductor package structures 1 a as shown in FIG. 2.

Figure 17:
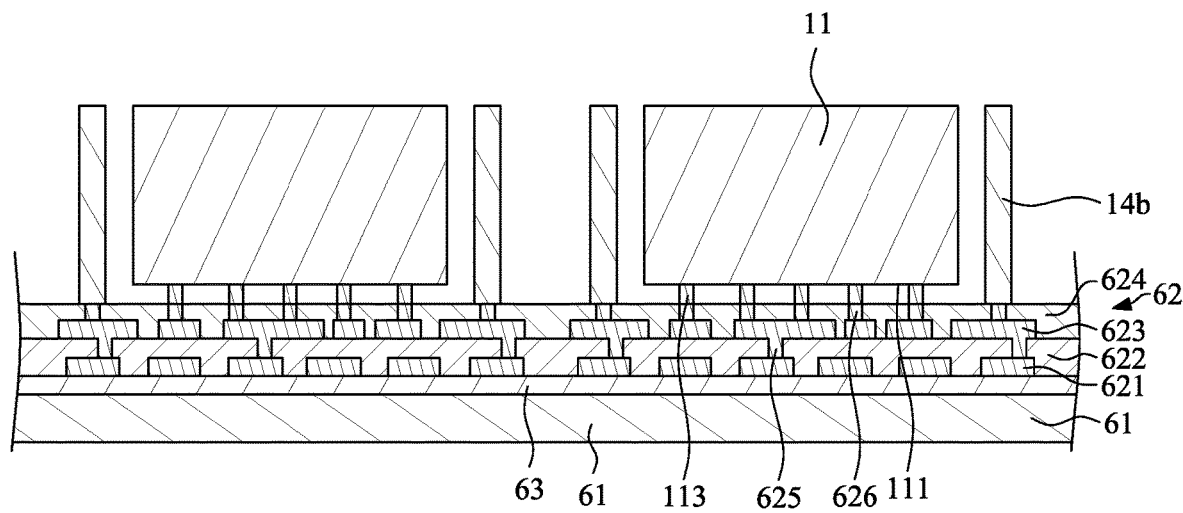
FIG. 17 illustrates one or more stages of an example of a semiconductor manufacturing process according to some embodiments of the present disclosure.

FIGS. 17 to 21 illustrate a semiconductor manufacturing process according to some embodiments of the present disclosure. In some embodiments, the semiconductor manufacturing process is for manufacturing a semiconductor package structure such as the semiconductor package structure 1b shown in FIG. 3. The initial stages of the illustrated process are the same as, or similar to, the stages illustrated in FIG. 6 through FIG. 7. FIG. 17 depicts a stage subsequent to that depicted in FIG. 7.

Referring to FIG. 17, the conductive elements 14b are formed on the wiring layer 62 and are electrically connected to the wiring layer 62 by, for example, plating. In some embodiments, the conductive elements 14b may be metal pillars. A material of the conductive elements 14b may be a conductive metal, such as copper, or another metal or combination of metals.

Figure 18:
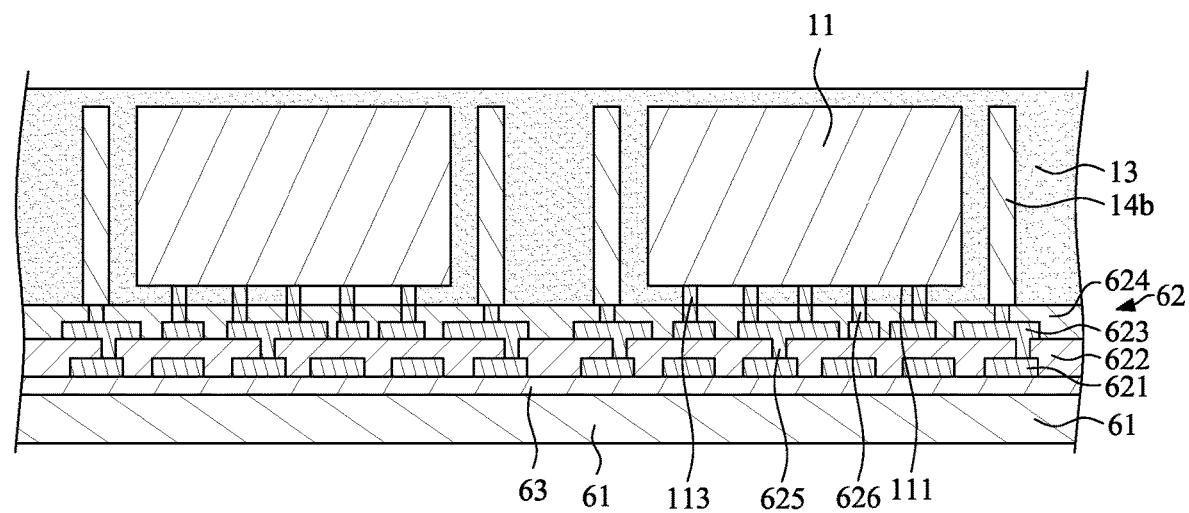
FIG. 18 illustrates one or more stages of an example of a semiconductor manufacturing process according to some embodiments of the present disclosure.

Referring to FIG. 18, the encapsulant 13 is formed to surround the at least one semiconductor die 11 and the conductive elements 14b. The encapsulant 13 is formed from an encapsulating material, and a Young's Modulus of the encapsulant 13 is between 0.001 GPa and 1 GPa. In some embodiments, the encapsulating material includes a liquid polymer such epoxy, rubber, silicone rubber, silicone mold compound or polyimide. In some embodiments, the encapsulating material may include silicon filler. A content of the silicon filler in the encapsulating material may be about 1% to about 30% by weight. The above encapsulating material may be utilized to form the encapsulant 13 instead of the typical molding compound. The encapsulating material may be formed by coating, dispensing or molding. After a curing process, the encapsulating material is cured to become the encapsulant 13. Due to the low Young's Modulus, the encapsulant 13 of the present disclosure is soft. Therefore, the semiconductor package structure of the present disclosure can be bent to be attached to the substrate, the interposer or the printed circuit board during the reflow process. Thus, the warpage problem can be resolved. The semiconductor package structure of the present disclosure can meet the design specifications for the total warpage amount. In some embodiments, the encapsulant 13 covers the at least one semiconductor die 11 and the conductive elements 14b.

Figure 19:
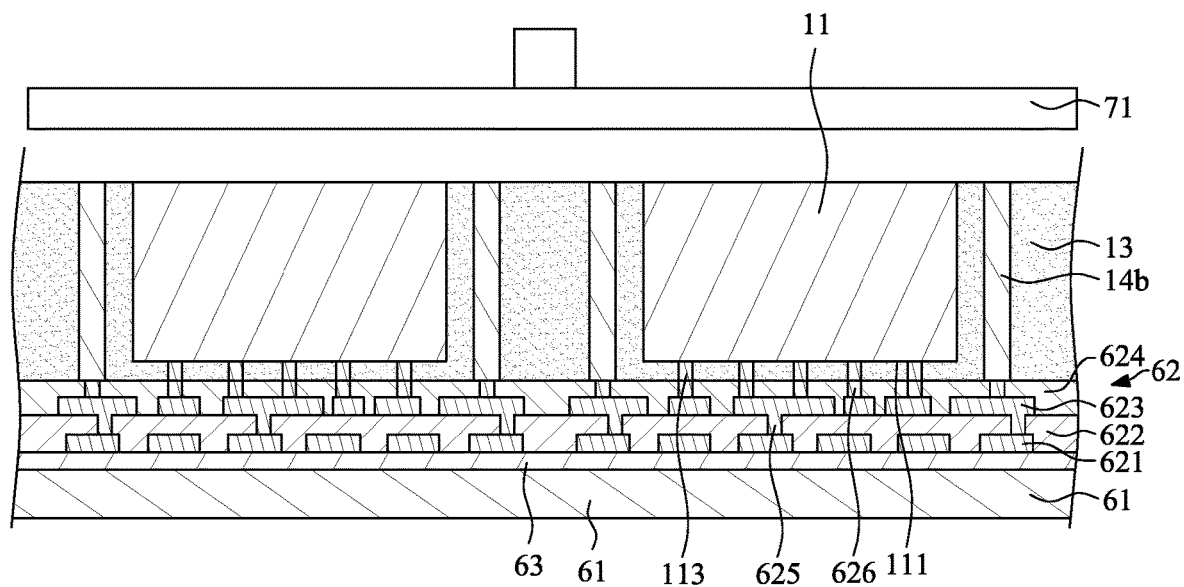
FIG. 19 illustrates one or more stages of an example of a semiconductor manufacturing process according to some embodiments of the present disclosure.

Referring to FIG. 19, in order to expose part of the conductive element 14b and part of the semiconductor die 11, the encapsulant 13 is ground by a grinding tool 71.

Figure 20:
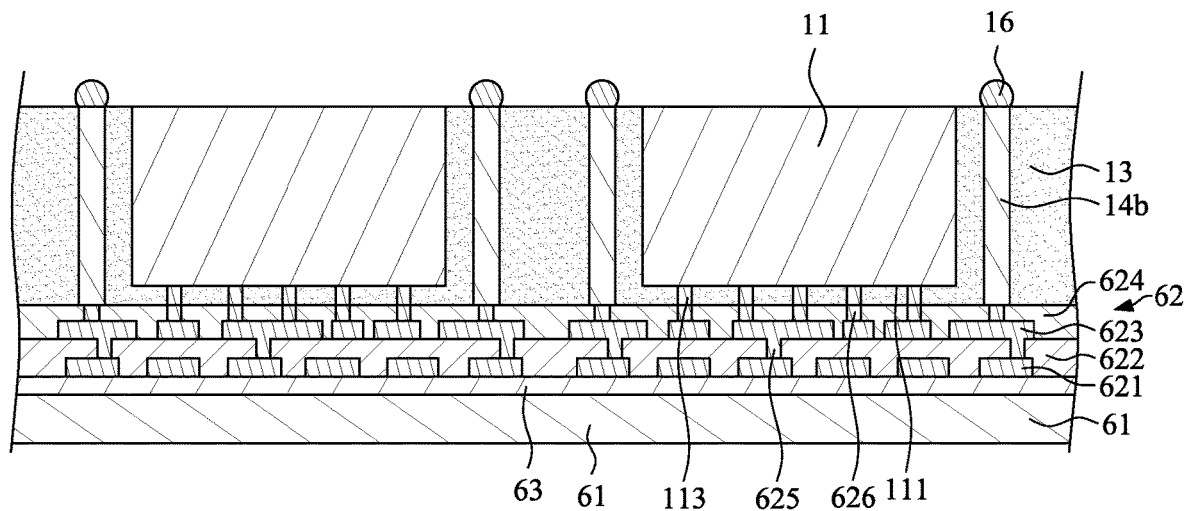
FIG. 20 illustrates one or more stages of an example of a semiconductor manufacturing process according to some embodiments of the present disclosure.

Referring to FIG. 20, a plurality of second solder connectors 16 are mounted on the conductive elements 14b, and the second solder connectors 16 are electrically connected to the conductive elements 14b. The second solder connectors 16 may be used for electrically connecting to the external element.

Figure 21:
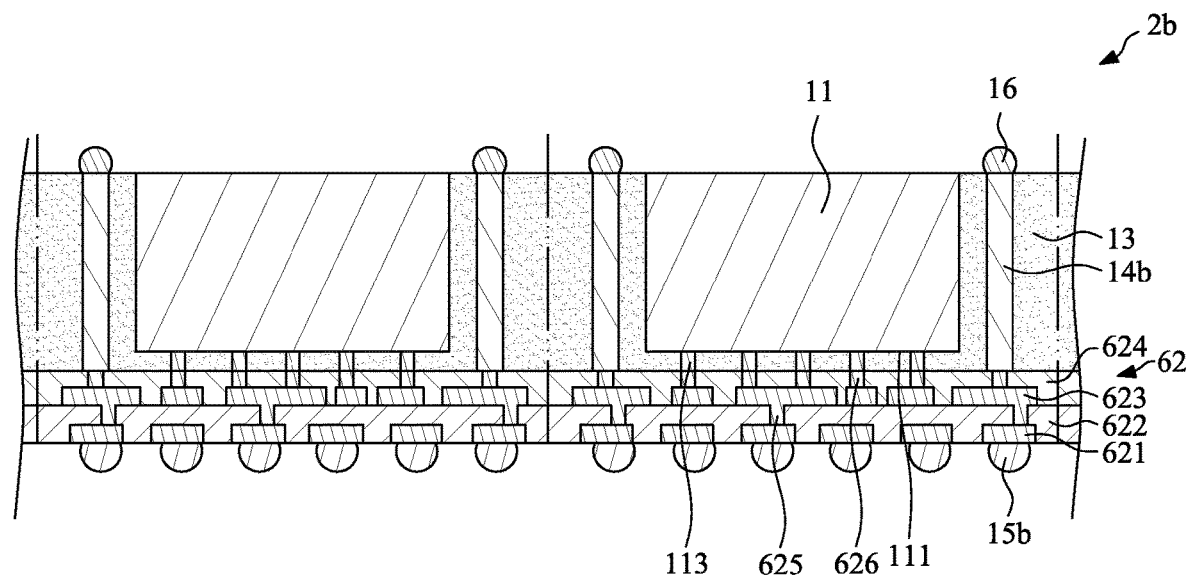
FIG. 21 illustrates one or more stages of an example of a semiconductor manufacturing process according to some embodiments of the present disclosure.

Referring to FIG. 21, the carrier 61 and the release layer 63 are removed. Then, a plurality of first solder connectors 15b are formed to electrically connected to the at least one wiring layer 62. A material of the first solder connectors 15b may be a conductive metal, such as tin, or another metal or combination of metals. Thus, a semiconductor wafer level package 2b is formed. The semiconductor wafer level package 2b includes at least one semiconductor die 11, at least one wiring layer 62, the encapsulant 13 and a plurality of conductive elements 14b. The semiconductor die 11 has an active surface 111. The at least one wiring structure 62 is electrically connected to the active surface 111 of the semiconductor die 11. The encapsulant 13 surrounds the at least one semiconductor die 11. The encapsulant 13 is formed from an encapsulating material, and a Young's Modulus of the encapsulant 13 is between 0.001 G Pa and 1 G Pa. The conductive elements 14b are embedded in the encapsulant 13, and are electrically connected to the at least one wiring layer 62.

Figure 22:
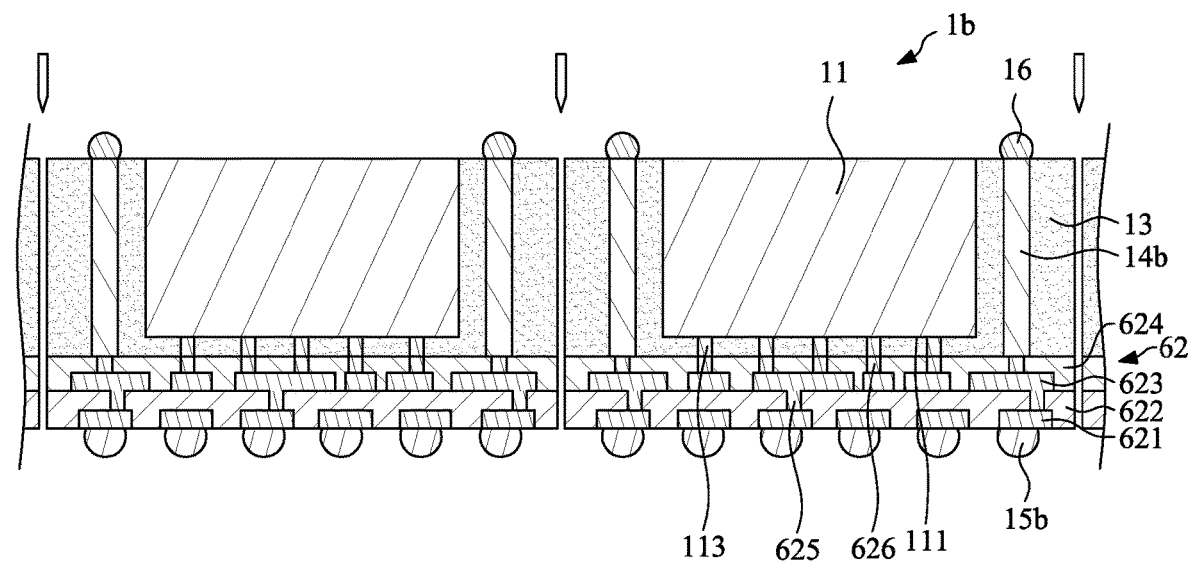
FIG. 22 illustrates one or more stages of an example of a semiconductor manufacturing process according to some embodiments of the present disclosure.

Referring to FIG. 22, a singulation process is conducted to cut the semiconductor wafer level package 2b to form each of semiconductor package structures 1b as shown in FIG. 3.

Figure 23:
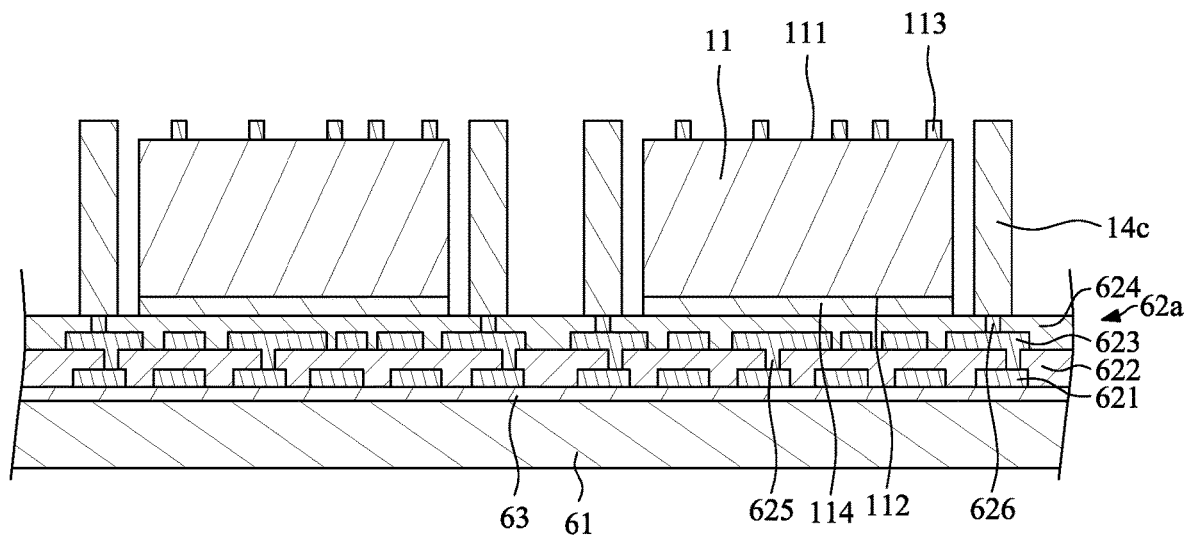
FIG. 23 illustrates one or more stages of an example of a semiconductor manufacturing process according to some embodiments of the present disclosure.

FIGS. 23 to 27 illustrate a semiconductor manufacturing process according to some embodiments of the present disclosure. In some embodiments, the semiconductor manufacturing process is for manufacturing a semiconductor package structure such as the semiconductor package structure 1c shown in FIG. 4. The initial stages of the illustrated process are the same as, or similar to, the stages illustrated in FIG. 6. FIG. 23 depicts a stage subsequent to that depicted in FIG. 6.

Referring to FIG. 23, at least one semiconductor die 11 is adhered to the first wiring layer 62a through an adhesive layer 114. The semiconductor die 11 has an active surface 111 and a back surface 112. In some embodiments, the back surface 112 of the semiconductor die 11 is adhered to the first wiring layer 62a through an adhesive layer 114. Then, the conductive elements 14c are formed on the first wiring layer 62a and are electrically connected to the first wiring layer 62a. In some embodiments, the conductive elements 14c may be metal pillars. A material of the conductive elements 14c may be a conductive metal, such as copper, or another metal or combination of metals.

Figure 24:
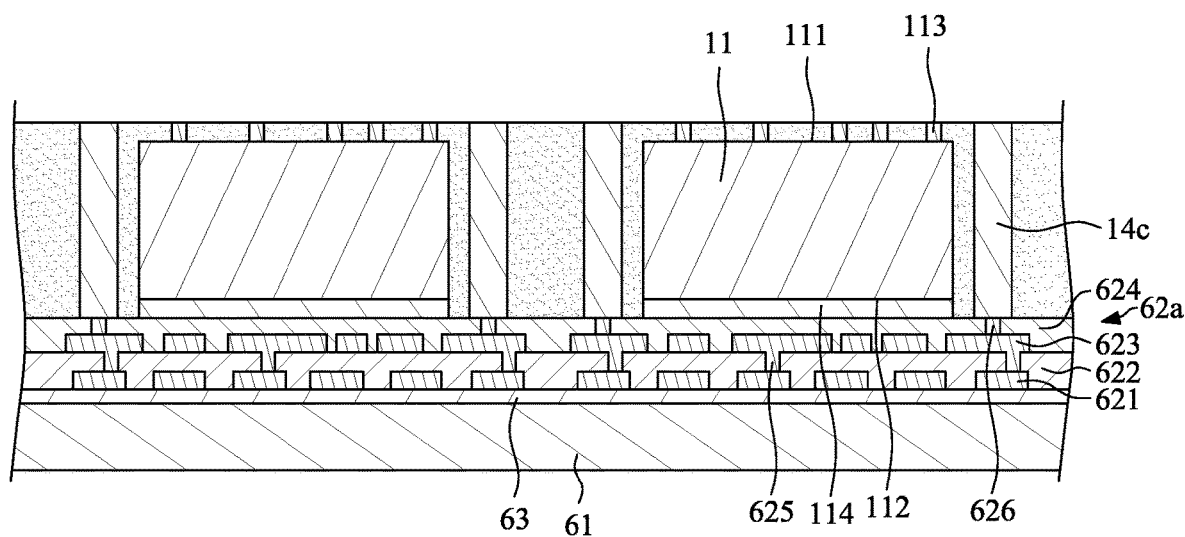
FIG. 24 illustrates one or more stages of an example of a semiconductor manufacturing process according to some embodiments of the present disclosure.

Referring to FIG. 24, the encapsulant 13 is formed to surround the at least one semiconductor die 11 and the conductive elements 14c. The encapsulant 13 is formed from an encapsulating material, and a Young's Modulus of the encapsulant 13 is between 0.001 GPa and 1 GPa. In some embodiments, the encapsulating material includes a liquid polymer such epoxy, rubber, silicone rubber, silicone mold compound or polyimide. In some embodiments, the encapsulating material may include silicon filler. A content of the silicon filler in the encapsulating material may be about 1% to about 30% by weight. The above encapsulating material may be utilized to form the encapsulant 13 instead of the typical molding compound. The encapsulating material may be formed by coating, dispensing or molding. After a curing process, the encapsulating material is cured to become the encapsulant 13. Due to the low Young's Modulus, the encapsulant 13 of the present disclosure is soft. Therefore, the semiconductor package structure 1c (FIG. 4) of the present disclosure can be bent to be attached to the substrate, the interposer or the printed circuit board during the reflow process. Thus, the warpage problem can be resolved. The semiconductor package structure 1c (FIG. 4) of the present disclosure can meet the design specifications for the total warpage amount.

Figure 25:
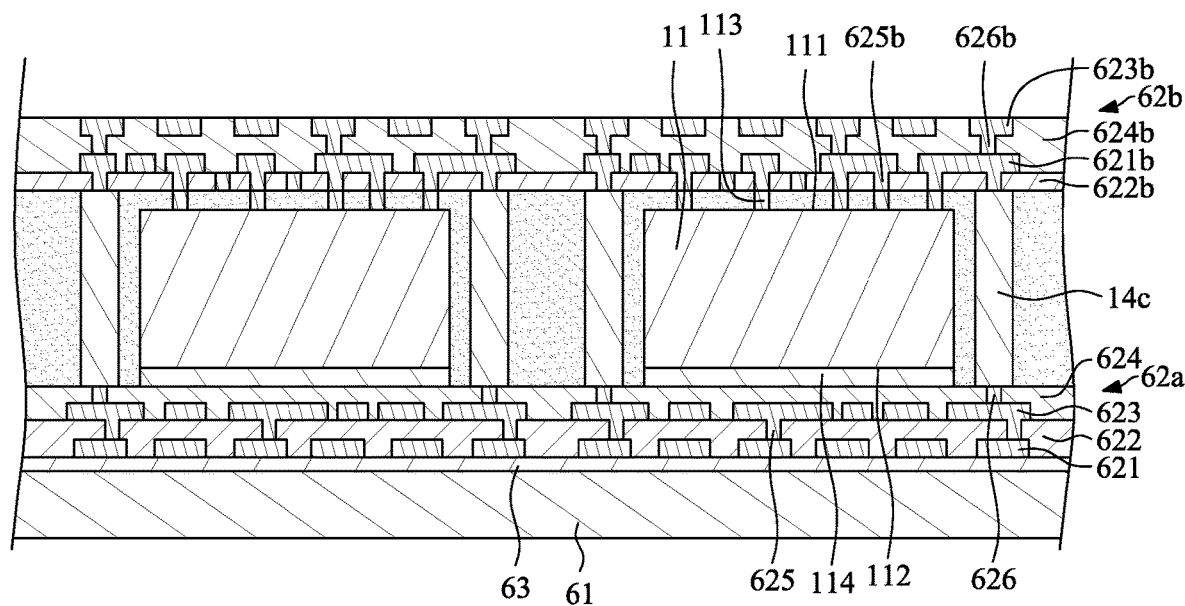
FIG. 25 illustrates one or more stages of an example of a semiconductor manufacturing process according to some embodiments of the present disclosure.

Referring to FIG. 25, a second wiring layer 62b is formed on the at least one semiconductor die 11 and the encapsulant 13, the second wiring layer 62b is electrically connected to the active surface 111 of the semiconductor die 11 and the conductive elements 14c. In some embodiments, the wiring layer 62b may include a first redistribution layer 621b, a first dielectric layer 622b, a second redistribution layer 623b and a second dielectric layer 624b. The first redistribution layer 621b is disposed on the first dielectric layer 622b. The second dielectric layer 624b covers first redistribution layer 621b and the second redistribution layer 623b. The first redistribution layer 621b may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The first redistribution layer 621b may include at least one conductive via 625b disposed in the through hole of the first dielectric layer 622b, and at least one conductive pad. In some embodiments, the first redistribution layer 621b may further include at least one trace. The conductive vias 625b are electrically connected to the conductive pillars 113 of the semiconductor die 11.

In some embodiments, the first dielectric layer 622b may be made of an insulating material or a dielectric material, such as, for example, polypropylene (PP). It is noted that the first dielectric layer 622b may include, or be formed from, a cured photoimageable dielectric (PID) material such as epoxy or polyimide (PI) including photoinitiators. The first dielectric layer 622b defines at least one through hole extending through the first dielectric layer 622b.

In some embodiments, the second redistribution layer 623b is electrically connected to the first redistribution layer 621b. The second redistribution layer 623b may include a seed layer and a conductive layer. A material of the seed layer may be, for example, titanium or copper. In some embodiments, the seed layer may include a titanium layer and a copper layer. A material of the conductive layer may be, for example, a conductive metal, such as copper, or another metal or combination of metals. However, in some embodiments, the seed layer may be omitted. The second redistribution layer 623b may include at least one conductive via 626b disposed in the through hole of the second dielectric layer 624b, and at least one conductive pad. In some embodiments, the second redistribution layer 621b may further include at least one trace. In some embodiments, the second redistribution layer 623b is electrically connected to the first redistribution layer 621b through the conductive vias 626b.

In some embodiments, the second dielectric layer 624b may be made of an insulating material or a dielectric material, such as, for example, polypropylene (PP). It is noted that the second dielectric layer 624b may include, or be formed from, a cured photoimageable dielectric (PID) material such as epoxy or polyimide (PI) including photoinitiators. The second dielectric layer 624b defines at least one through hole extending through the second dielectric layer 624b.

Figure 26:
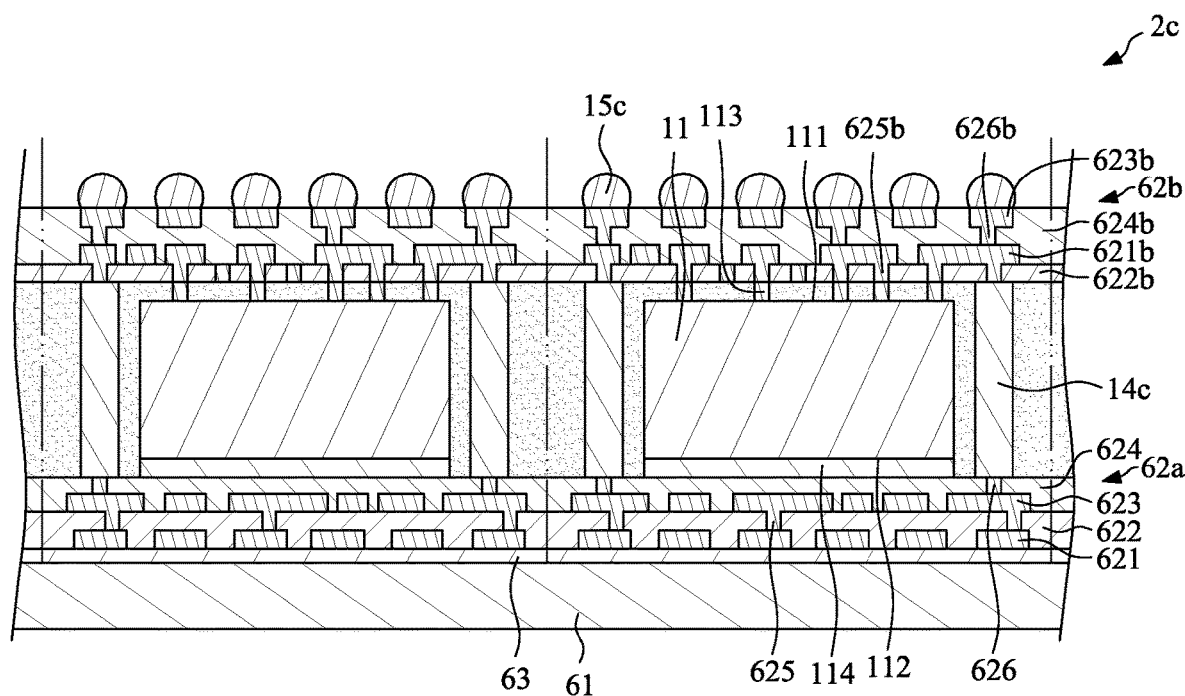
FIG. 26 illustrates one or more stages of an example of a semiconductor manufacturing process according to some embodiments of the present disclosure.

Referring to FIG. 26, a plurality of solder balls 15c are mounted on the second wiring layer 62b, and the solder balls 15c are electrically connected to the second wiring layer 62b. A material of the solder connectors 15c may be a conductive metal, such as tin, or another metal or combination of metals. A material of the solder connectors 15c may be a conductive metal, such as tin, or another metal or combination of metals.

Figure 27:
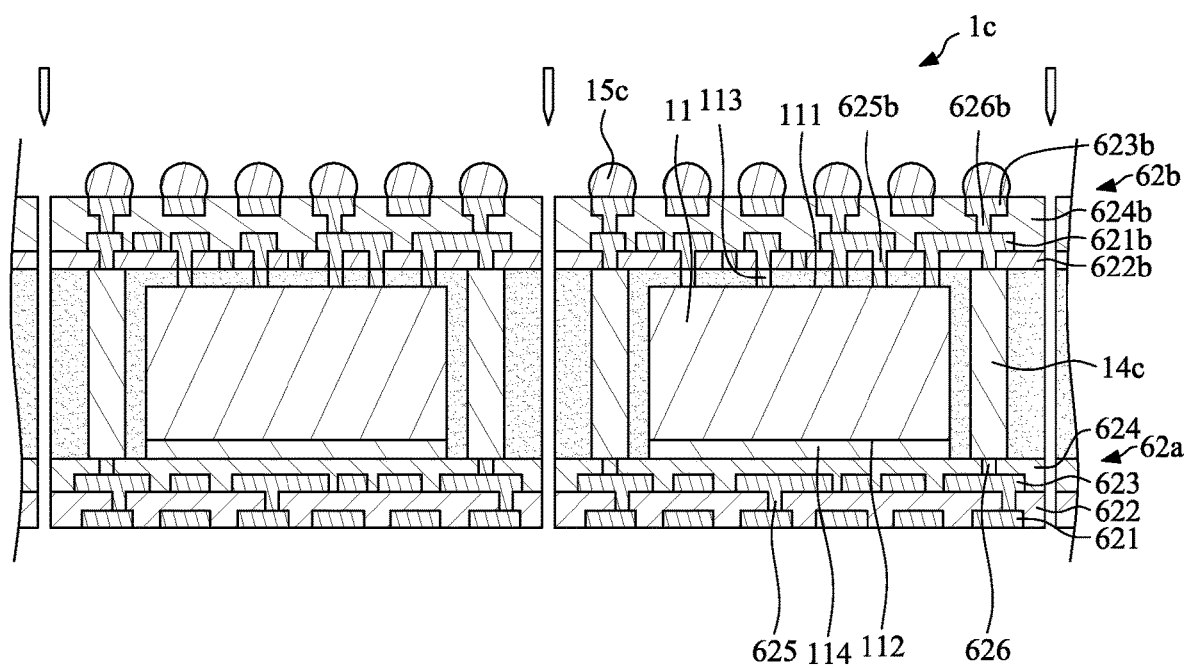
FIG. 27 illustrates one or more stages of an example of a semiconductor manufacturing process according to some embodiments of the present disclosure.

Referring to FIG. 27, the carrier 61 and the release layer 63 are removed to form a semiconductor wafer level package 2c. The semiconductor wafer level package 2c includes at least one semiconductor die 11, a first wiring layer 62a, a second wiring layer 62b, the encapsulant 13 and a plurality of conductive elements 14c. The semiconductor die 11 has an active surface 111 and a back surface 112. The second wiring structure 62b is electrically connected to the active surface 111 of the semiconductor die 11. The first wiring layer 62a is disposed adjacent to a back surface 112 of the semiconductor die 11, and the second wiring layer 62b is disposed adjacent to the active surface 111 of the semiconductor die 11. The encapsulant 13 surrounds the at least one semiconductor die 11. The encapsulant 13 is formed from an encapsulating material, and a Young's Modulus of the encapsulant 13 is between 0.001 GPa and 1 GPa. The conductive elements 14c are embedded in the encapsulant 13, and are electrically connected to the first wiring layer 62a and the second wiring layer 62b.

Then, a singulation process is conducted to cut the semiconductor wafer level package 2c to form each of semiconductor package structures 1c as shown in FIG. 4.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to +2%, less than or equal to ±1%, less than or equal to +0.5%, less than or equal to +0.1%, or less than or equal to +0.05%. For example, two numerical values can be deemed to be "substantially" the same or equal if a difference between the values is less than or equal to +10% of an average of the values, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 m, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
a semiconductor die, having an active surface;
at least one wiring structure, electrically connected to the active surface of the semiconductor die;
an encapsulant, surrounding the semiconductor die, wherein the encapsulant is formed from an encapsulating material, a Young's Modulus of the encapsulant is from 0.001 GPa to 1 Gpa, the encapsulating material includes a plurality of silicon fillers, and a content of the silicon filler in the encapsulating material is 1% to 30%; and
a plurality of conductive elements, embedded in the encapsulant, and electrically connected to the at least one wiring structure.

2. The semiconductor package structure of claim 1, wherein the encapsulating material includes epoxy, rubber, silicone rubber, silicone mold compound or polyimide.

3. The semiconductor package structure of claim 1, wherein a flexibility of the semiconductor package structure is larger than 1000 μm.

4. The semiconductor package structure of claim 1, wherein a thickness of the semiconductor package structure is less than 200 μm.

5. The semiconductor package structure of claim 1, wherein the semiconductor package structure comprises a first wiring structure and a second wiring structure, the first wiring structure is disposed adjacent to a back surface of the semiconductor die, and the second wiring structure is disposed adjacent to the active surface of the semiconductor die.

6. The semiconductor package structure of claim 1, wherein the encapsulant defines a recess portion disposed on a periphery of the semiconductor package structure.

7. A semiconductor wafer level package, comprising:
   at least one semiconductor die, having an active surface;
   at least one wiring layer, electrically connected to the active surface of the semiconductor die;
   an encapsulant, surrounding the at least one semiconductor die, wherein the encapsulant is formed from an encapsulating material, a Young's Modulus of the encapsulant is from 0.001 GPa to 1 GPa, the encapsulating material includes a plurality of silicon fillers, and a content of the silicon filler in the encapsulating material is 1% to 30%; and
   a plurality of conductive elements, embedded in the encapsulant, and electrically connected to the at least one wiring layer.

8. The semiconductor wafer level package of claim 7, wherein the encapsulating material includes epoxy, rubber, silicone rubber, silicone mold compound or polyimide.

9. The semiconductor wafer level package of claim 7, wherein the semiconductor wafer level package includes a first wiring layer and a second wiring layer, the first wiring layer is disposed adjacent to a back surface of the semiconductor die, and the second wiring layer is disposed adjacent to the active surface of the semiconductor die.

10. The semiconductor wafer level package of claim 7, wherein the encapsulant defines a recess portion disposed on an area between two adjacent semiconductor dies.

11. A semiconductor manufacturing process, comprising:
    (a) providing a carrier;
    (b) forming a wiring layer on the carrier;
    (c) mounting at least one semiconductor die on the wiring layer; and
    (d) forming an encapsulant and a plurality of conductive elements, wherein the encapsulant surrounds the at least one semiconductor die, the conductive elements are embedded in the encapsulant and electrically connected to the wiring layer, wherein the encapsulant is formed from an encapsulating material, a Young's Modulus of the encapsulant is from 0.001 GPa to 1 GPa, the encapsulating material includes a plurality of silicon fillers, and a content of the silicon filler in the encapsulating material is 1% to 30%.

12. The semiconductor manufacturing process of claim 11, wherein (d) comprises:
    (d1) forming the encapsulant surrounding the at least one semiconductor die;
    (d2) forming a plurality of through holes extending through the encapsulant; and
    (d3) forming the conductive elements in the through holes.

13. The semiconductor manufacturing process of claim 12, wherein in (d2), a laser is used to drill the through holes.

14. The semiconductor manufacturing process of claim 13, wherein a part of the conductive element is exposed.

15. The semiconductor manufacturing process of claim 11, wherein (d) comprises:
    (d1) forming the conductive elements electrically connected to the wiring layer; and
    (d2) forming the encapsulant surrounding the at least one semiconductor die and the conductive elements.

16. The semiconductor manufacturing process of claim 11, wherein in (b), a first wiring layer is formed on the carrier; in (c), the at least one semiconductor die is mounted on the first wiring layer; in (d), the conductive elements electrically are connected to the first wiring layer, and the process further comprises: forming a second wiring layer on the at least one semiconductor die and the encapsulant, the second wiring layer is electrically connected to the at least one semiconductor die and the conductive elements.

17. The semiconductor manufacturing process of claim 11, wherein after (d), the process further comprises:
    (e) removing the carrier;
    (f) mounting a plurality of solder balls on the wiring layer, and the solder balls electrically connected to the wiring layer; and
    (g) singulating to form each of semiconductor package structures.

* * * * *